United States Patent [19]
Jenkins, IV et al.

[11] Patent Number: 6,167,560
[45] Date of Patent: Dec. 26, 2000

[54] ONE-COLD ENCODING METHOD FOR LOW POWER OPERATION IN A COMPLEX PROGRAMMABLE LOGIC DEVICE

[75] Inventors: Jesse H. Jenkins, IV, Danville; Edel M. Young, Palo Alto, both of Calif.

[73] Assignee: Xilinx, Inc., San Jose, Calif.

[21] Appl. No.: 09/061,805

[22] Filed: Apr. 16, 1998

[51] Int. Cl.⁷ .................................................. G06F 1/02
[52] U.S. Cl. ............................................................ 716/17
[58] Field of Search ...................... 395/500.18; 307/465; 356/52

[56] References Cited

U.S. PATENT DOCUMENTS

| | | | |
|---|---|---|---|
| 4,774,421 | 9/1988 | Hartmann | 307/465 |
| 5,388,248 | 2/1995 | Robinson | 356/52 |
| 5,481,484 | 1/1996 | Ogawa | 395/500.18 |
| 5,642,404 | 6/1997 | Simpson | 364/735 |

OTHER PUBLICATIONS

"The ISP Application Guide and CPLD Data Book", (May 1997) pp. 3–1 to 3–67, available from Xilinx, Inc., 2100 Logic Drive, San Jose, California 95124.

*Primary Examiner*—Paul R. Lintz
*Assistant Examiner*—Thuan Do
*Attorney, Agent, or Firm*—E. Eric Hoffman, Esq.; Edel M. Young

[57] ABSTRACT

A method for selecting the state assignments of a complex programmable logic device (CPLD) to minimize power consumption. Within the CPLD, a plurality of macrocells are selected to store a corresponding plurality of state variables, wherein the number of macrocells is selected to be equal to the number of states. For each of the states, one of the macrocells is assigned to store a state variable having a first logic state, and the remaining macrocells are assigned to store state variables having a second logic state. The macrocells storing state variables having the second logic state exhibit a lower power consumption than the macrocell storing the state variable having the first logic state. In addition, each of the macrocells includes a plurality of wired logic gates, each being in a high-current state or a low-current state. The number of wired logic gates in the low-current state is maximized in the macrocells assigned to store the state variables having the second logic state. As a result of these state assignments, the CPLD exhibits a relatively low power consumption.

19 Claims, 4 Drawing Sheets

ONE-COLD ENCODING METHOD FOR LOW POWER OPERATION IN A COMPLEX PROGRAMMABLE LOGIC DEVICE

FIELD OF THE INVENTION

The present invention relates to a method of operating a complex programmable logic device (CPLD). More specifically, the present invention relates to a low power method for implementing state machines in a sense amplifier based CPLD.

BACKGROUND OF THE INVENTION

CMOS logic circuits are typically designed to consume minimal power when operating, particularly when there are no logic transitions within the logic circuit. For standard CMOS logic circuits, minimal power consumption is realized because the CMOS logic devices do not draw significant current when there are no logic transitions. However, complex programmable logic devices (CPLDs) typically do not exhibit low power consumption, based on the use of wired logic gates within the CPLD architecture. As described below, the use of wired logic gates causes CPLDs to exhibit significant power consumption, even during static conditions. As a result, CPLDs experience increased power consumption not only as a function of switching frequency, but also as a function of the states of the wired logic gates.

Power consumption within a CPLD is calculated by multiplying the current drawn by the CPLD times the voltage drop across the CPLD. It is common to isolate three distinct regions of a device for the sake of simplicity when calculating power consumption, namely, the input circuitry, the output circuitry and the interior circuitry. The input and output circuitry is not of concern, because the CPLD input and output circuitry uses conventional CMOS digital circuitry. As a result, the CPLD input and output circuitry does not contribute greatly to the power consumption of the device.

However, the interior circuitry of a CPLD differs substantially from the transistor structure found in CMOS digital circuits such as common logic chips, field programmable gate arrays (FPGAs) and application specific integrated circuits (ASICs). The interior circuitry of CPLDs is substantially composed of non-volatile programmable logic cells. More specifically, the interior circuitry of most CPLDs is built from EPROM, EEPROM or FLASH memory elements that are used to form wired logic gates inside the chip.

FIG. 1 is a circuit diagram of a basic wired logic gate (i.e., a wired AND gate) of the type typically found in a CPLD. Wired AND gate 10 includes sense amplifier 1, bit line 2, resistors 3 and 4, and n-channel non-volatile memory transistors 5–7, which are switched by input signals $\overline{A}$, $\overline{B}$ and $\overline{C}$. These input signals can be provided, for example, by input logic pins, by internal logic variables, or by internal state variables received from binary flip flops. Wired AND gate 10 operates as follows. Sense amplifier 1 is powered by the $V_{CC}$ supply voltage. Resistor 3 is connected between the $V_{CC}$ voltage supply terminal and bit line 2. Resistor 4 is connected between bit line 2 and the ground supply terminal. If none of transistors 5–7 is in a conductive state, then a relatively high voltage drop is developed across resistor 4, thereby maintaining bit line 2 at a voltage $V_{BITLINE\_HI}$. When the voltage of bit line 2 is equal to the voltage $V_{BITLINE\_HI}$, bit line 2 is said to be in a logic high state. The voltage $V_{BITLINE\_HI}$ is greater than the trip point voltage $V_{TRIP}$ required to cause sense amplifier 1 to provide a logic high output signal (OUT).

In general, a non-volatile memory transistor includes a floating gate, which can be programmed to store either a negative charge or a neutral charge. When programmed to store a negative charge, a non-volatile memory transistor is said to be in an erased state. When programmed to store a neutral charge, a non-volatile memory transistor is said to be in a programmed state. When a non-volatile memory transistor is in the erased state, the negative charge stored by the floating gate prevents the non-volatile memory transistor from turning on regardless of the voltage applied to the control gate of the non-volatile memory transistor. When a non-volatile memory transistor is in the programmed state, the neutral charge stored by the floating gate allows the non-volatile memory transistor to be controlled by the voltage applied to the control gate of the non-volatile memory transistor.

Thus, if non-volatile memory transistors 5–7 are in the erased state, then these transistors 5–7 will not turn on, regardless of the voltages of the applied $\overline{A}$, $\overline{B}$ and $\overline{C}$ signals. Under these conditions, bit line 2 will always be in the logic high state, regardless of the $\overline{A}$, $\overline{B}$ and $\overline{C}$ signals.

When in the programmed state, non-volatile memory transistors 5–7 will turn on if the respective signals $\overline{A}$, $\overline{B}$ and $\overline{C}$ are asserted at logic high levels, and will turn off if the respective signals $\overline{A}$, $\overline{B}$ and $\overline{C}$ are asserted at logic low levels. When non-volatile memory transistors 5–7 are in the programmed state, wired AND gate 10 becomes a three-input AND gate. Under these conditions, if each of the $\overline{A}$, $\overline{B}$ and $\overline{C}$ signals have logic low values (i.e., the A, B and C signals have logic high values), then transistors 5–7 are each turned off, and bit line 2 is in the logic high state. However, if any of the $\overline{A}$, $\overline{B}$ and $\overline{C}$ signals has a logic high value, then the corresponding transistor(s) will turn on. For example, if the $\overline{A}$ signal has a logic high value and the $\overline{B}$ and $\overline{C}$ signals have logic low values, then transistor 5 is turned on and transistors 6 and 7 are turned off. As a result, the current from bit line 2 to the ground supply terminal is shared between resistor 4 and transistor 5. The turned on transistor 5 causes the voltage on bit line 2 to be reduced to a voltage level $V_{BITLINE\_LO}$, which is less than the trip point voltage $V_{TRIP}$ of sense amplifier 1. When the voltage of bit line 2 is equal to $V_{BITLINE\_LOW}$, bit line 2 is said to be in a logic low state.

FIG. 2 is a graph showing the voltages $V_{CC}$, $V_{TRIP}$, $V_{BITLINE\_HI}$ and $V_{BITLINE\_LO}$. As illustrated in FIG. 2, bit line 2 is always maintained at a voltage greater than zero Volts. As a result, wired AND gate 10 will always draw current, regardless of the state of wired AND gate 10. The current drawn by wired AND gate 10 is a primary source of power consumption in a CPLD. Table 1 below summarizes conventional currents drawn by wired AND gate 10.

TABLE 1

|  | High-Speed Logic Gate | Low-Power Logic Gate |
|---|---|---|
| Current Drawn For $V_{BITLINE\_HI}$ | 180 µA | 20 µA |
| Current Drawn For $V_{BITLINE\_LO}$ | 350 µA | 200 µA |

Note that Table 1 defines two variations of wired AND gate 10, namely, a high-speed variation and a low-power variation. The high-speed variation is implemented by selecting resistor 3 to have a relatively small resistance. The low-power variation is implemented by selecting resistor 3 to have a relatively large resistance.

Referring to Table 1, it is seen that in both the high-speed and low-power variations, much less current is drawn by wired AND gate 10 when bit line 2 is in the logic high state. However, many bit lines of a CPLD are typically in the logic low state, thereby increasing the power consumption of the CPLD. From a power consumption standpoint, it would therefore be desirable to maximize the number of bit lines in the logic high state. However, it is difficult to constrain the exterior signals in order to maintain a high number of logic high bit lines.

In general, a CPLD is a configurable digital logic device that includes an array of wired AND gates which are configured to generate a plurality of product terms, and a plurality of OR gates which are coupled to receive the product terms from the wired AND gates. CPLDs are often configured to implement state machines for digital logic circuits. In general, a state machine defines the states and state transitions of a digital logic circuit. Each state is represented by a binary number, which is stored by a set of flip flops within the CPLD. State machines are well known to those skilled in the art.

The binary state assignments for state machines that control digital logic circuits have been a source of research for several decades. The primary focus has been to determine state assignments which can be systematically applied, and which optimize circuit behavior. Optimization of circuit behavior can include such items as minimizing the required amount of external logic, improving operating speed or minimizing the required number of cell inputs. The most common state assignments include binary state assignments, Gray code state assignments and one-hot state assignments. These common state assignments are described briefly below.

State assignments are typically stored in flip flops within a CPLD. The input and output terminals of the flip flops (along with other logic circuitry) are coupled in a manner which provides the desired states and state transitions. The contents of the flip flops define the present state of the state machine.

When using binary state assignments, consecutive states are assigned consecutive binary numbers. A state machine having $2^N$ binary state assignments is typically implemented using N flip flops. For example, a state machine having eight binary state assignments is typically implemented using three flip flops. Table 2 shows how eight binary state assignments are implemented using three flip flops.

TABLE 2

|         | 1st Flip Flop | 2nd Flip Flop | 3rd Flip Flop |
|---------|---------------|---------------|---------------|
| State 1 | 0 | 0 | 0 |
| State 2 | 0 | 0 | 1 |
| State 3 | 0 | 1 | 0 |
| State 4 | 0 | 1 | 1 |
| State 5 | 1 | 0 | 0 |
| State 6 | 1 | 0 | 1 |
| State 7 | 1 | 1 | 0 |
| State 8 | 1 | 1 | 1 |

When using Gray code state assignments, the consecutive states are assigned binary numbers that differ by a minimum number of bit changes. A state machine having $2^N$ Gray code state assignments is typically implemented using N flip flops. For example, a state machine having eight Gray code state assignments can be implemented using three flip flops. Table 3 shows how eight Gray code state assignments are implemented using three flip flops.

TABLE 3

|         | 1st Flip Flop | 2nd Flip Flop | 3rd Flip Flop |
|---------|---------------|---------------|---------------|
| State 1 | 0 | 0 | 0 |
| State 2 | 0 | 0 | 1 |
| State 3 | 0 | 1 | 1 |
| State 4 | 0 | 1 | 0 |
| State 5 | 1 | 1 | 0 |
| State 6 | 1 | 1 | 1 |
| State 7 | 1 | 0 | 1 |
| State 8 | 1 | 0 | 0 |

When using one-hot state assignments, each state is assigned a dedicated binary bit, and only one bit is high at any given time. A state machine having N one-hot state assignments is implemented using N flip flops. For example, a state machine having eight one-hot state assignments is implemented using eight flip flops. Table 4 shows how eight one-hot state assignments are implemented using eight flip flops.

TABLE 4

|         | 1st Flip Flop | 2nd Flip Flop | 3rd Flip Flop | 4th Flip Flop | 5th Flip Flop | 6th Flip Flop | 7th Flip Flop | 8th Flip Flop |
|---------|---|---|---|---|---|---|---|---|
| State 1 | 1 | 0 | 0 | 0 | 0 | 0 | 0 | 0 |
| State 2 | 0 | 1 | 0 | 0 | 0 | 0 | 0 | 0 |
| State 3 | 0 | 0 | 1 | 0 | 0 | 0 | 0 | 0 |
| State 4 | 0 | 0 | 0 | 1 | 0 | 0 | 0 | 0 |
| State 5 | 0 | 0 | 0 | 0 | 1 | 0 | 0 | 0 |
| State 6 | 0 | 0 | 0 | 0 | 0 | 1 | 0 | 0 |
| State 7 | 0 | 0 | 0 | 0 | 0 | 0 | 1 | 0 |
| State 8 | 0 | 0 | 0 | 0 | 0 | 0 | 0 | 1 |

Because of power usage, it would be desirable to have a method of operating a CPLD that maximizes the number of bit lines maintained in a logic high state.

SUMMARY

Accordingly, the present invention provides a method for selecting the state assignments of a complex programmable logic device (CPLD) to maximize the number of bit lines in the low-current logic high state, thereby minimizing power consumption.

Within the CPLD, a plurality of macrocells are selected to store a corresponding plurality of state variables, wherein the number of macrocells is selected to be equal to the number of states. For example, a state machine having eight states would use eight macrocells. For each of the states, one of the macrocells is assigned to store a state variable having a first logic state, and the remaining macrocells are assigned to store state variables having a second logic state. In the described example, at any given time, one macrocell stores a state variable having a logic "0" value, and seven macrocells store a state variable having a logic "1" value. Because this state assignment is the complement of a "one-hot" state assignment, the state assignment of the present invention is referred to as a "one-cold" state assignment.

Each macrocell typically includes a plurality of wired AND gates. The number of wired AND gates maintained in the low-current, logic high state is maximized within the macrocells that store state variables having the second logic state. As a result, a relatively large number of macrocells store state variables having the second logic state, and within this relatively large group of macrocells, a relatively large number of wired AND gates are maintained in a low-current, logic high state. As a result, the overall power consumption of the CPLD is reduced when compared with conventional CPLDs.

The present invention will be more fully understood in view of the following description and drawings.

DETAILED DESCRIPTION

In accordance with the present invention, state machines for sense amplifier based CPLDs are implemented by adopting a state assignment chosen to maximize the number of bit lines which are driven high at any given time. This state assignment, which is described in more detail below, is defined as a "one-cold" state assignment, because this assignment is the binary complement of the above-described one-hot state assignment.

When using one-cold state assignments, each state is assigned a dedicated binary bit, and only one bit is low at any given time. A state machine having N one-cold state assignments is implemented using N flip flops. For example, a state machine having eight one-cold state assignments is implemented using eight flip flops. Table 5 shows how eight one-cold state assignments are implemented using eight flip flops, in accordance with one embodiment of the invention.

TABLE 5

|  | 1st Flip Flop | 2nd Flip Flop | 3rd Flip Flop | 4th Flip Flop | 5th Flip Flop | 6th Flip Flop | 7th Flip Flop | 8th Flip Flop |
| --- | --- | --- | --- | --- | --- | --- | --- | --- |
| State 1 | 0 | 1 | 1 | 1 | 1 | 1 | 1 | 1 |
| State 2 | 1 | 0 | 1 | 1 | 1 | 1 | 1 | 1 |
| State 3 | 1 | 1 | 0 | 1 | 1 | 1 | 1 | 1 |
| State 4 | 1 | 1 | 1 | 0 | 1 | 1 | 1 | 1 |
| State 5 | 1 | 1 | 1 | 1 | 0 | 1 | 1 | 1 |
| State 6 | 1 | 1 | 1 | 1 | 1 | 0 | 1 | 1 |
| State 7 | 1 | 1 | 1 | 1 | 1 | 1 | 0 | 1 |
| State 8 | 1 | 1 | 1 | 1 | 1 | 1 | 1 | 0 |

The one-cold state assignments defined by Table 5 advantageously reduce power consumption in a sense amplifier based CPLD in the manner described below.

Figure 1:
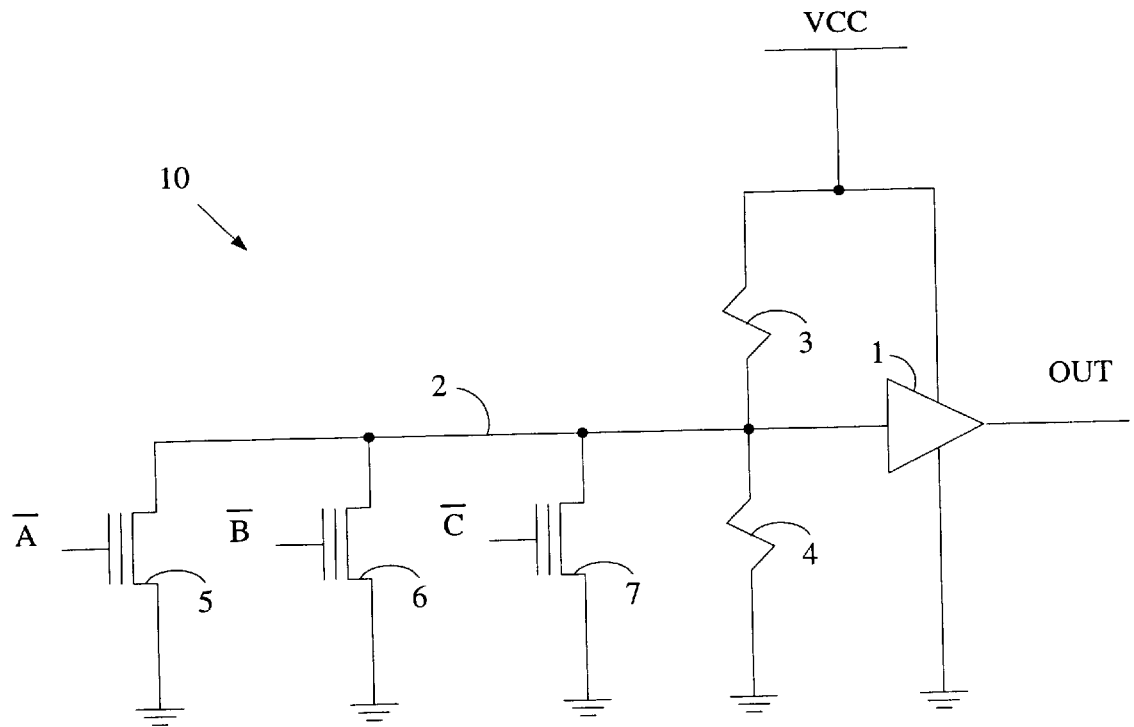
FIG. 1 is a circuit diagram of conventional wired AND gate.
Figure 2:
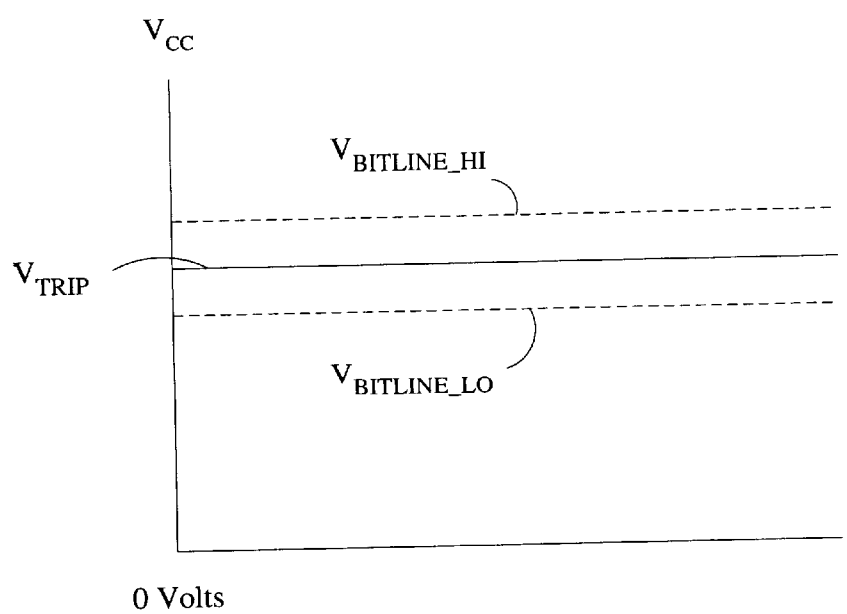
FIG. 2 is a graph illustrating the trip voltage, the high bit line voltage and the low bit line voltage of the wired AND gate of FIG. 1.
Figure 3:
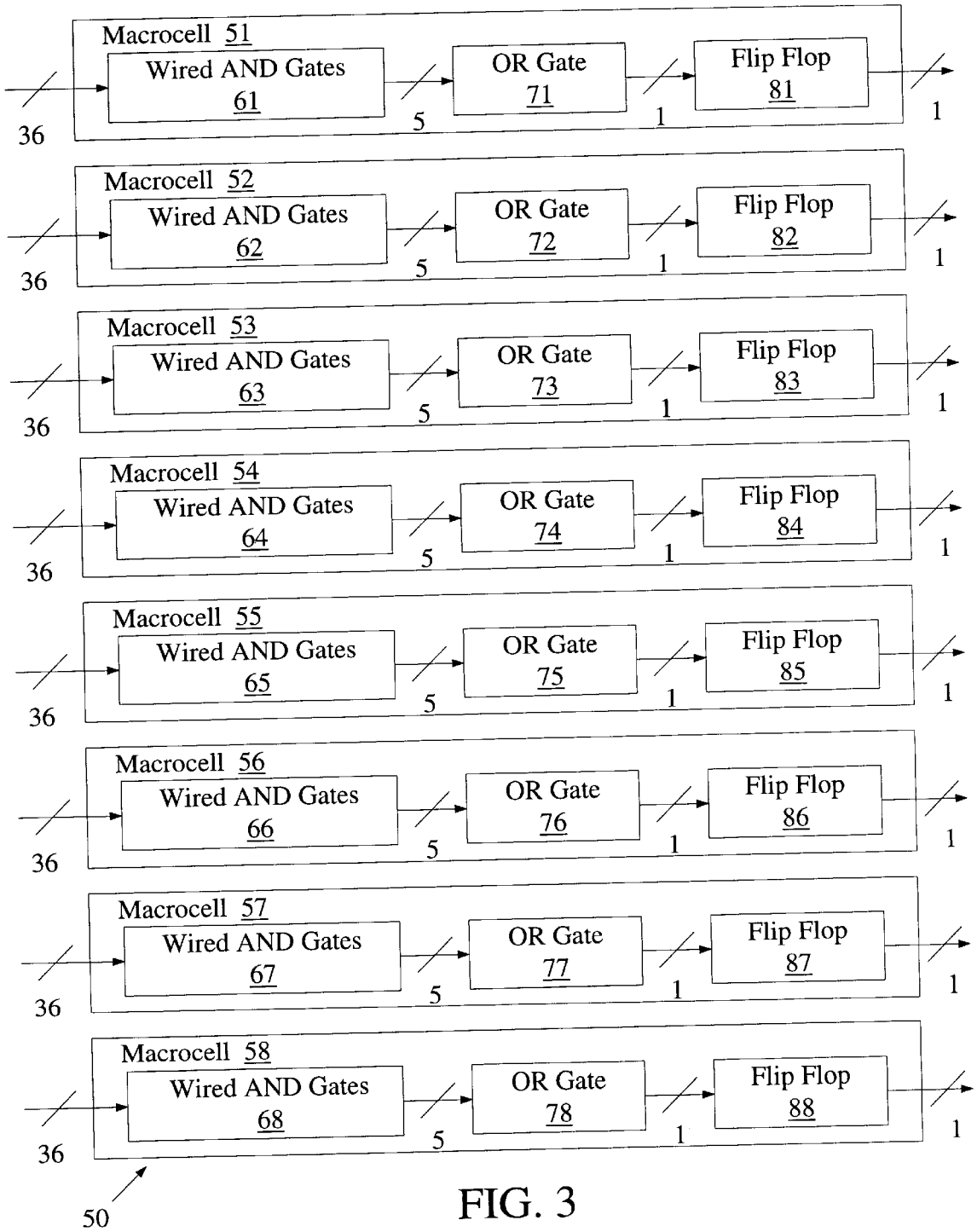
FIG. 3 is a block diagram of a portion of a CPLD which is controlled in accordance with one embodiment of the present invention.

FIG. 3 is a block diagram of a portion of a conventional CPLD 50. The illustrated portion of CPLD 50 includes eight macrocells 51–58. Each of macrocells 51–58 includes a set of wired AND gates, an OR gate, and a flip flop. More specifically, macrocells 51–58 include wired AND gate sets 61–68, respectively, OR gates 71–78, respectively, and flip flops 81–88, respectively. It is understood that a conventional CPLD typically includes many more than eight macrocells. It is also understood that conventional macrocells typically include additional circuitry, which is not illustrated in FIG. 3 for purposes of clarity. CPLD 50 and macrocells 51–58 are conventional elements which are present in the XC9500 In-System Programmable CPLD Family available from Xilinx, Inc., 2100 Logic Drive, San Jose, Calif. 95124. CPLD 50 and macrocells 51–58 are described in more detail in "The ISP Application Guide and CPLD Data Book" (May 1997) pp. 3-1 to 3-67, available from Xilinx.

In one embodiment of the present invention, the eight macrocells 51–58 are configured to implement an 8-state state machine using the one-cold state assignments of Table 5. In this embodiment, flip flops 81–88 store state data values which are representative of the state of the state machine. In accordance with the one-cold state assignments, the macrocells 51–58 are configured such that only one of the flip flops 81–88 provides a logic low state data value, and the other seven flip flops provide logic high data values. Thus only one macrocell will have all bit lines pulling low. This macrocell will require more current than the logic high macrocells, but there will be only one such macrocell, and thus the overall power consumption is low. In other embodiments, other sizes of state machines can be implemented. In general, one flip flop is required for each state.

Figure 4A:
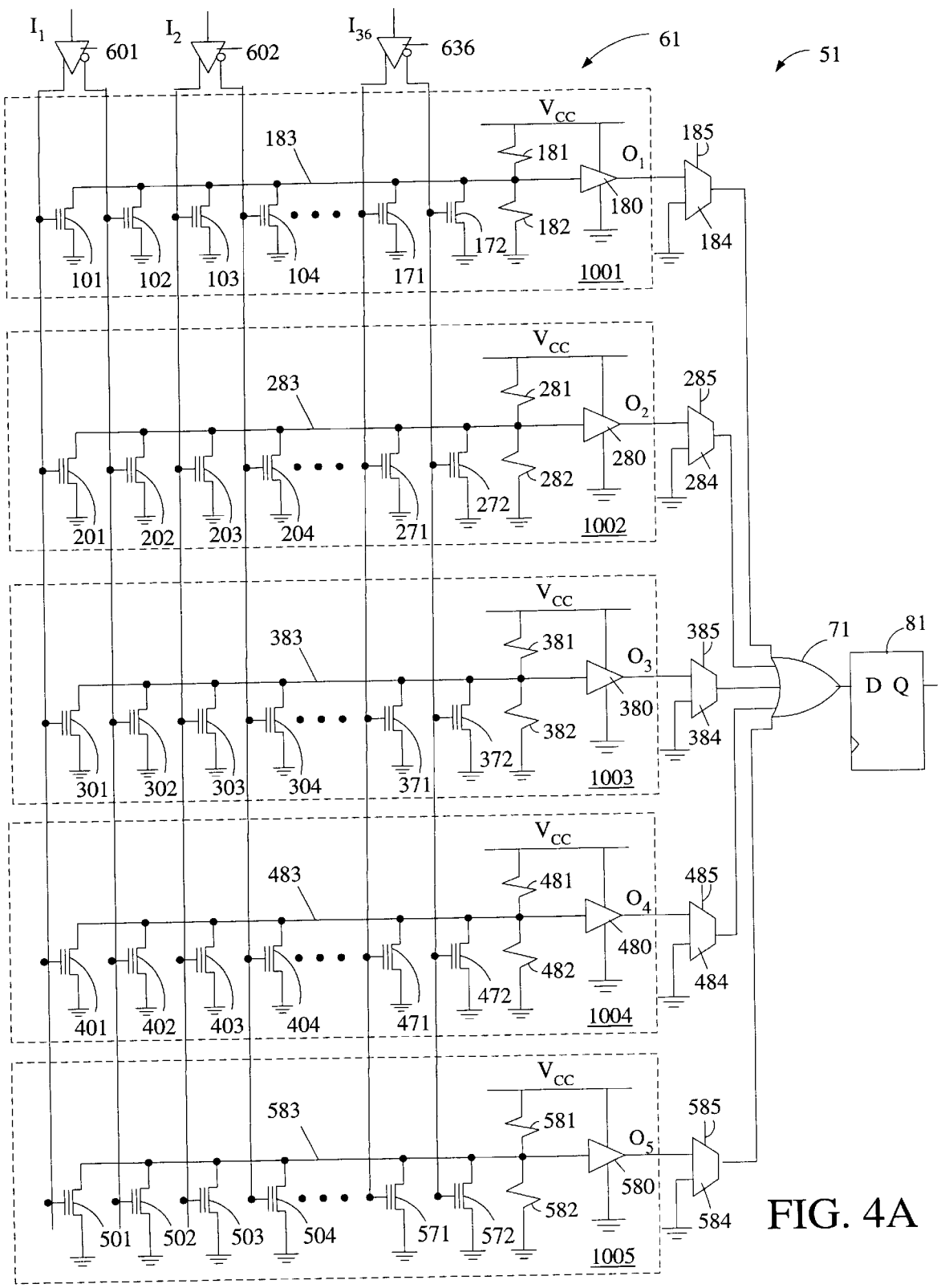
FIGS. 4a and 4b are circuit diagrams of a macrocell that is controlled in accordance with two embodiments of the present invention.
Figure 4B:
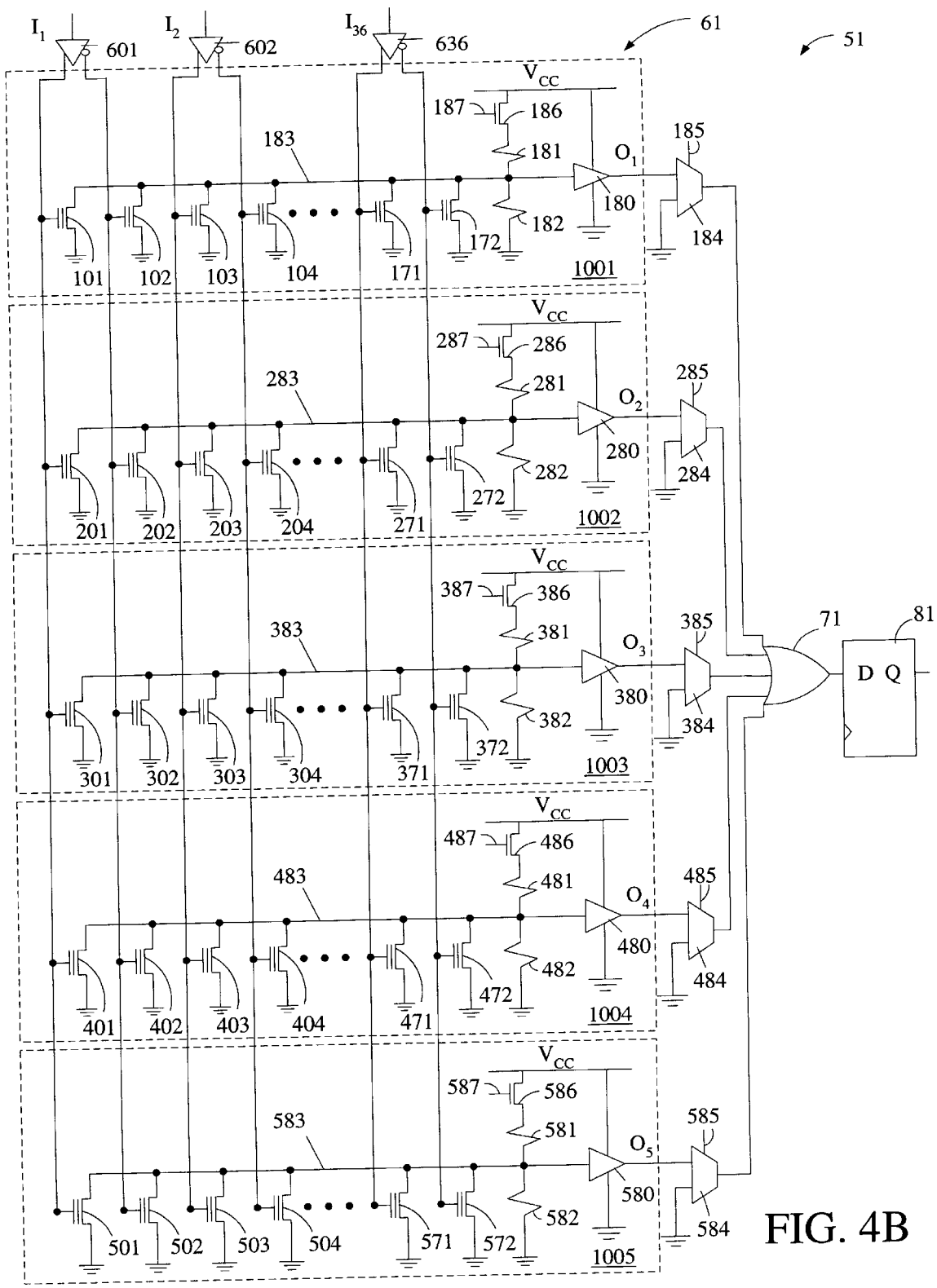

FIGS. 4a and 4b are circuit diagrams of macrocell 51 in accordance with two embodiments of the present invention. Since these two figures are similar, they will be described together. As described above, macrocell 51 typically includes other circuitry which is not illustrated in FIGS. 4a and 4b. Macrocells 52–58 are identical to macrocell 51, and are therefore not described in detail.

Macrocell 51 includes five wired AND gates 1001–1005 (which form the set of wired AND gates 61), five-input OR gate 71 and flip flop 81. The output terminals $O_1$–$O_5$ of wired AND gates 1001–1005 are coupled directly or indirectly to the five input terminals of OR gate 71. In FIG. 4a, the output terminals $O_1$–$O_5$ of AND gates 1001–1005 are coupled through multiplexers 184, 284, 384, 484, and 584 to OR gate 71. In FIG. 4b, the output terminals $O_1$–$O_5$ are directly coupled to OR gate 71. The output terminal of OR gate 71 is coupled to the D input terminal of flip flop 81.

Wired AND gate 1001 includes seventy-two non-volatile memory transistors 101–172, sense amplifier 180, resistors 181–182, and bit line 183. To provide clarity in the figure, not all of the non-volatile memory transistors 101–172 are shown. Similarly, wired AND gates 1001–1005 include non-volatile memory transistors 201–272, 301–372, 401–472 and 501–572, respectively, sense amplifiers 280, 380, 480, and 580, respectively, resistors 281–282, 381–382, 481–482 and 581–582, respectively, and bit lines 283, 383, 483 and 583, respectively. Because wired AND gates 1001–1005 are all configured in the same manner, only wired AND gate 1001 is described in detail.

Within wired AND gate 1001, the odd-numbered non-volatile memory transistors (i.e., transistors 101, 103, . . . 171) are coupled to receive 36 corresponding input signals $I_1$–$I_{36}$ from input buffers 601–636, respectively. The even-numbered non-volatile memory transistors (i.e., transistors 102, 104, . . . 172) are coupled to receive 36 complementary input signals $\overline{I}_1$–$\overline{I}_{36}$ from input buffers 601–636, respectively. Up to 36 of the non-volatile memory transistors 101–172 can be placed in the programmed state, thereby activating up to 36 of the input signals. Note that non-volatile memory transistors which receive complementary input signals are not both placed in the programmed state. For example, only one (or neither) of non-volatile memory transistors 101 and 102 is placed in the programmed state. If both of transistors 101 and 102 were placed in the programmed state, both the $I_1$ and $\overline{I}_1$ input signals would be activated. Because one of these complementary input signals is necessarily a logic high signal, one of transistors 101 or 102 would always be turned on. As a result, bit line 183 would always be in a logic low state.

To program AND gate 1001 as a three input AND gate with an output signal $O_1$ which is the logical AND of the $I_1$, $I_2$ and $I_{36}$ input signals, transistors 102, 104 and 172 are placed in the programmed state, and transistors 101, 103 and 104–171 are placed in the erased state. In this case, the input signals applied to transistors 101, 103 and 104–171 have no effect on the output signal $O_1$. When each of the input signals $I_1$, $I_2$ and $I_{36}$ has a logic high value, transistors 102, 104 and 172 are turned off, thereby placing bit line 183 in a logic high state and providing a logic high output signal $O_1$. If any one of input signals $I_1$, $I_2$ or $I_{36}$ has a logic low value, then bit line 183 is placed in a logic low state, thereby providing a logic low output signal $O_1$.

In accordance with the one-cold state assignments, at any given time, one of flip flops 81–88 stores a logic "0" value, while the other seven flip flops store logic "1" values. In order for one of the flip flops 81–88 to receive a logic "0" value, the associated OR gate must receive five logic "0" values. For example, for flip flop 81 to receive a logic "0" value, each of wired AND gates 1001–1005 must provide a logic "0" output signal to OR gate 71. Under these conditions, each of the bit lines 183, 283, 383, 483 and 583 is in a logic low condition. As described above, each bit line in a logic low state results in a relatively high current. In order for one of flip flops 81–88 (FIG. 3) to receive a logic "1" value, the associated OR gate must provide a logic "1" value. This will occur as long as at least one of the input terminals of the OR gate receives a logic "1" value. For example, for flip flop 81 to receive a logic "1" value, at least one of wired AND gates 1001–1005 must provide a logic "1" output signal to OR gate 71. Providing more than one logic "1" output signal to OR gate 71 does not change the logical result of the OR operation. Therefore, in accordance with the present invention, when the current state requires flip flop 81 to receive a logic "1" value, the number of wired AND gates 1001–1005 providing a logic "1" output signal to OR gate 71 is maximized. Thus, if the state assignments can be made such that each of wired AND gates 1001–1005 provides a logic "1" output signal, then the state assignments are made in this manner. As a result, the number of bit lines 183, 283, 383, 483 and 583 in a logic high state are maximized.

When a bit line is not to be used for a logic function, this bit line is disabled and draws minimal power. In FIG. 4a, the transistors controlling the bit line are left unprogrammed, and the output multiplexer is programmed to provide a logic 0 output signal. For example, if bit line 583 is not to be used, transistors 501–572 are left unprogrammed, thus leaving bit line 583 high (low power state) and multiplexer 584 is programmed by control line 585 to provide ground voltage to OR gate 71. In FIG. 4b, transistors 501–572 may be programmed or not. However, bit line 583 is brought to a low state by applying a logic 0 signal to line 587, thus turning off transistor 586 and allowing transistor 582 to pull bit line 583 to ground. Since there is no current path through transistor 581, this embodiment achieves low power.

In fact, the one-cold state assignment lends itself to a large number of logical "don't care" conditions that result in a large number of bit lines being maintained in a low power state. Having many bit lines in a low power state results in a relatively low current being drawn by the device as a whole.

In another example, the user desires to form the function $X=A+B+\overline{C}$ in macrocell 51 and the function $Y=A+C+D$ in macrocell 52. Other macrocells will not be used. One of many ways to form these functions according to the invention is to apply signal A to $I_1$, signal B to $I_2$, and signal C to $I_{36}$. Signal D will be applied to a line not shown. During the programming stage, transistor 102 will be programmed so that a low signal on $I_1$ will pull down bit line 183; transistor 204 will be programmed so that a low signal on $I_2$ will pull down line 283; and transistor 571 will be programmed so that a high signal on line $I_{36}$ will pull down line 583. Transistors on all unused input lines will be left unprogrammed and all unused bit lines will be disabled. The output value X will be taken from OR gate 71 or registered in flip flop 81. Only when A is low, B is low, and C is high will OR gate 71 output a low signal. Thus the desired function $X=A+B+\overline{C}$ of macrocell 51 is achieved, and the current drawn by the circuit of FIG. 4a or 4b is relatively low because only the used bit lines 183, 283, and 583 will draw significant current.

Another circuit equivalent to that of FIG. 4 will implement the function $Y=A+C+D$ in macrocell 52. In this simple example, all other macrocells shown in FIG. 3 will be unused for this purpose and therefore will not contribute to the power consumption of the one-cold state machine. Since C will be high when $\overline{C}$ is low, the output of macrocell 52 will be high when the output of macrocell 51 is low, and no more than one macrocell will have a low output value, thus achieving the one-cold result of the invention. Furthermore, no unused bit line will draw significant current. The software will achieve the low power result by minimizing the number of bit lines used, and thus minimize the number of bit lines that draw current.

As described above, the number of used bit lines in the logic high state is maximized within the macrocells which store a logic "1" value in their associated flip flops. In addition, the one-cold state assignments maximize the number of macrocells which have flip flops storing logic "1" values.

As described above, maximizing the number of used bit lines in the logic high state (thereby minimizing the number of used bit lines in the logic low state) advantageously minimizes the power consumption of CPLD 50. The reduction of power consumption becomes apparent when comparing the percentage of bit lines maintained in the logic low state in the one-cold state assignments with the number of bit lines maintained in the logic low state in equivalent binary, Gray code and one-hot state assignments.

For example, a state machine using the one-hot state assignments summarized in Table 4 would require that at least 35 of the 40 bit lines (87.5 percent) would have to be in the high-current, logic low state in order to provide seven of eight flip flops with logic low values. Similarly, a state machine using either the binary or Gray code state assignments summarized in Tables 2 and 3, respectively, would require, on average, that 7.5 of the 15 bit lines (50 percent) would have to be in the high-current, logic low state in order to provide the three flip flops with the required logic low values. With a structure such as shown in FIG. 4a or FIG. 4b, unused bit lines are in a low power mode and used bit lines are mostly high, which consumes less power than the logic low state. Thus, the one-cold state assignments in accordance with the present invention advantageously provides a substantial reduction in power consumption when compared with the one-hot, binary and Gray code state assignments.

As a further step in minimizing power consumption, the timing of the input signals can be determined such that the length of time the bit lines are pulled low is minimized. In some situations, the input signals with undesirable states can be brought to those states only shortly before the clock input to the flip flops causes the output signals to be captured.

Although the invention has been described in connection with several embodiments, it is understood that this invention is not limited to the embodiments disclosed, but is capable of various modifications which would be apparent to a person skilled in the art. For example, although the present invention has been described in connection with CPLDs, it is understood that the one-cold state assignments of the present invention can also be applied to other circuits which implement wired logic gates. Moreover, although the present invention has been described in connection with wired AND gates, it is understood that the present invention is also applicable to other types of logic gates, such as wired NAND gates. Thus, the invention is limited only by the following claims.

What is claimed is:

1. A method for implementing a state machine having a plurality of states in a complex programmable logic device (CPLD) having a plurality of macrocells, the method comprising the steps of:

selecting a plurality of the macrocells to store a corresponding plurality of state variables, wherein the number of macrocells is selected to be equal to the number of states; and assigning, for each of the states, one of the macrocells to store a state variable having a first logic state, and assigning the remaining macrocells to store state variables having a second logic state, and wherein a macrocell storing the state variable having the first logic state exhibits greater power consumption than a macrocell storing a state variable having the second logic state.

2. The method of claim 1, wherein different macrocells are assigned to store the state variable having the first logic state for each of the different states.

3. The method of claim 1, wherein each of the macrocells includes a plurality of wired logic gates, each being in either a high-current state or a low-current state, the method further comprising the step of maximizing the number of wired logic gates in the low-current state in the macrocells assigned to store state variables having the second logic state.

4. The method of claim 3, further comprising the step of selecting the wired logic gates to be wired AND gates.

5. The method of claim 4, further comprising the step of routing output signals provided by the wired AND gates within each macrocell to an associated logical OR gate.

6. The method of claim 5, further comprising the step of routing an output signal provided by the logical OR gate within each macrocell to an associated flip flop, wherein the flip flop stores the state variable associated with the macrocell.

7. The method of claim 1, wherein the first logic state is a logic low state, and the second logic state is a logic high state.

8. The method of claim 3, wherein the low-current state of a wired logic gate is achieved by disconnecting the wired logic gate from a supply voltage.

9. The method of claim 3, wherein the low-current state of a wired logic gate is achieved by leaving transistors for pulling the wired logic gate to the high-current state unprogrammed and disconnecting an output terminal of the wired logic gate.

10. A circuit for implementing a state machine having a plurality of states in a complex programmable logic device (CPLD), the circuit comprising:

a plurality of macrocells for storing a corresponding plurality of state variables, wherein the number of macrocells is selected to be equal to the number of states, each of the macrocells comprising:

a plurality of wired logic gates, each having circuitry for selectively de-coupling the wired logic gate from a voltage supply terminal;

a logic gate coupled to the output terminals of the wired logic gates; and a storage element coupled to the output terminal of the logic gate.

11. The circuit of claim 10, wherein each of the wired logic gates is a wired AND gate.

12. The circuit of claim 10, wherein the logic gate is an OR gate.

13. The circuit of claim 10, wherein the storage element is a flip-flop.

14. The circuit of claim 10, wherein the circuitry for selectively de-coupling the wired logic gate comprises a pass transistor.

15. A circuit for implementing a state machine having a plurality of states in a complex programmable logic device (CPLD), the circuit comprising:

a plurality of macrocells for storing a corresponding plurality of state variables, wherein the number of macrocells is selected to be equal to the number of states, each of the macrocells comprising:

a plurality of wired logic gates, each having an output terminal;

a plurality of multiplexers, wherein each multiplexer has a first input terminal coupled to the output terminal of a corresponding wired logic gate, a second input terminal coupled to a voltage supply terminal, and an output terminal;

a logic gate coupled to the output terminals of the multiplexers; and a storage element coupled to the output terminal of the logic gate.

16. The circuit of claim 15, wherein each of the wired logic gates is a wired AND gate.

17. The circuit of claim 15, wherein the logic gate is an OR gate.

18. The circuit of claim 15, wherein the storage element is a flip-flop.

19. The circuit of claim 15, further comprising means for independently controlling the plurality of multiplexers.

* * * * *